(12) United States Patent
Tsai et al.

(10) Patent No.: US 6,838,866 B2
(45) Date of Patent: Jan. 4, 2005

(54) PROCESS FOR MEASURING DEPTH OF SOURCE AND DRAIN

(75) Inventors: Tzu-Ching Tsai, Taichung Hsien (TW); Hui Min Mao, Tainan Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 161 days.

(21) Appl. No.: 10/283,699

(22) Filed: Oct. 30, 2002

(65) Prior Publication Data

US 2004/0021473 A1 Feb. 5, 2004

(30) Foreign Application Priority Data

Aug. 5, 2002 (TW) .................................... 91117555 A

(51) Int. Cl.⁷ ........................ G01R 31/26; H01L 27/108
(52) U.S. Cl. .................. 324/71.5; 324/769; 324/158.1; 257/301; 438/243
(58) Field of Search ................. 324/71.5, 763, 324/765, 768–769, 158.1; 257/301, E21.548; 438/242–244, 387

(56) References Cited

U.S. PATENT DOCUMENTS

| 6,150,686 A | * | 11/2000 | Sugiura et al. ............. 257/301 |
| 6,377,067 B1 | * | 4/2002 | Yang et al. .................. 324/769 |
| 6,614,074 B2 | * | 9/2003 | Bronner et al. ............. 257/330 |

* cited by examiner

Primary Examiner—Minh N. Tang
(74) Attorney, Agent, or Firm—Quintero Law Office

(57) ABSTRACT

A process for measuring depth of a source and drain of a MOS transistor. The MOS transistor is formed on a semiconductor substrate on which a trench capacitor is formed and a buried strap is formed between the MOS transistor and the trench capacitor. The process includes the following steps. First, resistances of the buried strap at a plurality of different depths are measured. Next, a curve correlating the resistances with the depths is established. Next, slopes of the resistance to the depth for the curve are obtained. Finally, a depth corresponding to a minimum resistance before the slope of the resistance to the depth reaches to zero is obtained.

2 Claims, 6 Drawing Sheets

PROCESS FOR MEASURING DEPTH OF SOURCE AND DRAIN

BACKGROUND OF THE INVENTION

1. Field of the Invention

The present invention relates to a process for measuring the depth of a source and drain, and more particularly to a process for measuring the depth of a source and drain in a DRAM by measuring resistances of the buried strap between the trench capacitor and transistor at different depths.

2. Description of the Prior Art

Presently, dynamic random access memory (DRAM) is widely used. Generally, a DRAM cell includes a transistor and a capacitor. FIG. 1 shows a circuit diagram of a DRAM cell, in which a drain of an NMOS transistor 10 is connected to a storage electrode of a capacitor 20, a gate of the NMOS transistor is connected to a word line (WL), and a source is connected to a bit line (BL). In addition, an opposed electrode of the capacitor is connected to a constant voltage source. A dielectric layer is located between the storage electrode and opposed electrode. The NMOS transistor acts as a switch to control the charged or discharged state of the capacitor, thus generating the logic level of memory cell.

In the DRAM manufacturing process, a two-dimensional capacitor called a planar-type capacitor is mainly used for a conventional DRAM having a storage capacity less than 1M (mega=million) bits. In the case of a DRAM having a memory cell using a planar type capacitor, electric charges are stored on the main surface of a semiconductor substrate, and thus the main surface is required to have a large area. This type of a memory cell is therefore not suited to a DRAM having a high degree of integration.

For a highly integrated DRAM, such as a DRAM with more than 4M bits of memory, a three-dimensional capacitor, such as a stacked-type or a trench-type capacitor, has been introduced. With stacked-type or trench-type capacitors, it has been made possible to obtain a larger memory within a similar volume. In the trench capacitor manufacturing process, insulator (such as silicon oxide/ silicon oxynitride or silicon oxide/silicon oxynitride/silicon oxide) and conductor (such as heavily N-doped polysilicon) are formed by many times of deposition and etching to complete the structure. Generally, first, a photoresist mask is formed on a semiconducting substrate. The photoresist layer and semiconducting substrate are then etched to form a trench. Next, a storage electrode layer and a dielectric layer are successively formed in the trench. Finally, conducting material is filled in the trench to complete the trench capacitor.

In L. Nesbit, et al., "A 0.6 $\mu$m 256 Mb Trench DRAM Cell With Self-aligned Buried Strap (BEST)", 1993 IEDM, pp. 627–630, 1993, it is described a process for fabricating a trench capacitor in a DRAM cell.

In the DRAM manufacturing process, if the depth of source and drain does not reach the desired depth, the breakdown voltage of DRAM cell is decreased. Consequently, when the voltage applied to the gate has not reach the predetermined voltage, the DRAM cell is undesirably switched on. However, there is no effective way to measure the depth of source and drain until now.

SUMMARY OF THE INVENTION

The object of the present invention is to provide a process for measuring the depth of a source and drain of a MOS transistor in a simple and quick way.

According to a first aspect of the present invention, the MOS transistor is formed on a semiconducting substrate on which a trench capacitor is formed, a buried strap is formed between the MOS transistor and the trench capacitor. The process for measuring the depth of a source and drain of the MOS transistor includes the following steps. First, resistances of the buried strap at a plurality of different depths are measured. Next, a curve correlating the resistances with the depths is established. Next, slopes of the resistance to the depth for the curve are obtained. Finally, a depth corresponding to a minimum resistance before the slope of the resistance to the depth reaches to zero is obtained.

According to another aspect of the present invention, the MOS transistor is formed on a semiconducting substrate on which a trench capacitor is formed, a buried strap is formed between the MOS transistor and the trench capacitor, the buried strap is below the semiconducting substrate by a first length and has a second length, the buried strap is adjacent to a source of the MOS transistor, and the source has a third length. The process for measuring the depth of a source and drain of the MOS transistor includes the following steps. First, resistances of the buried strap at a plurality of different depths over the second length are measured. Next, a curve correlating the resistances with the depths is established. Next, slopes of the resistance to the depth for the curve are obtained. Next, a depth corresponding to a minimum resistance before the slope of the resistance to the depth reaches to zero is obtained. Finally, the first length is subtracted from the corresponding depth to obtain the third length.

BRIEF DESCRIPTION OF THE DRAWINGS

The present invention will become more fully understood from the detailed description given hereinbelow and the companying drawings, given by way of illustration only and thus not intended to be limitative of the present invention.

DETAILED DESCRIPTION OF THE INVENTION

FIGS. 2a to 2f are cross-sections illustrating an exemplary process flow of forming a trench capacitor according to the present invention.

Figure 1:
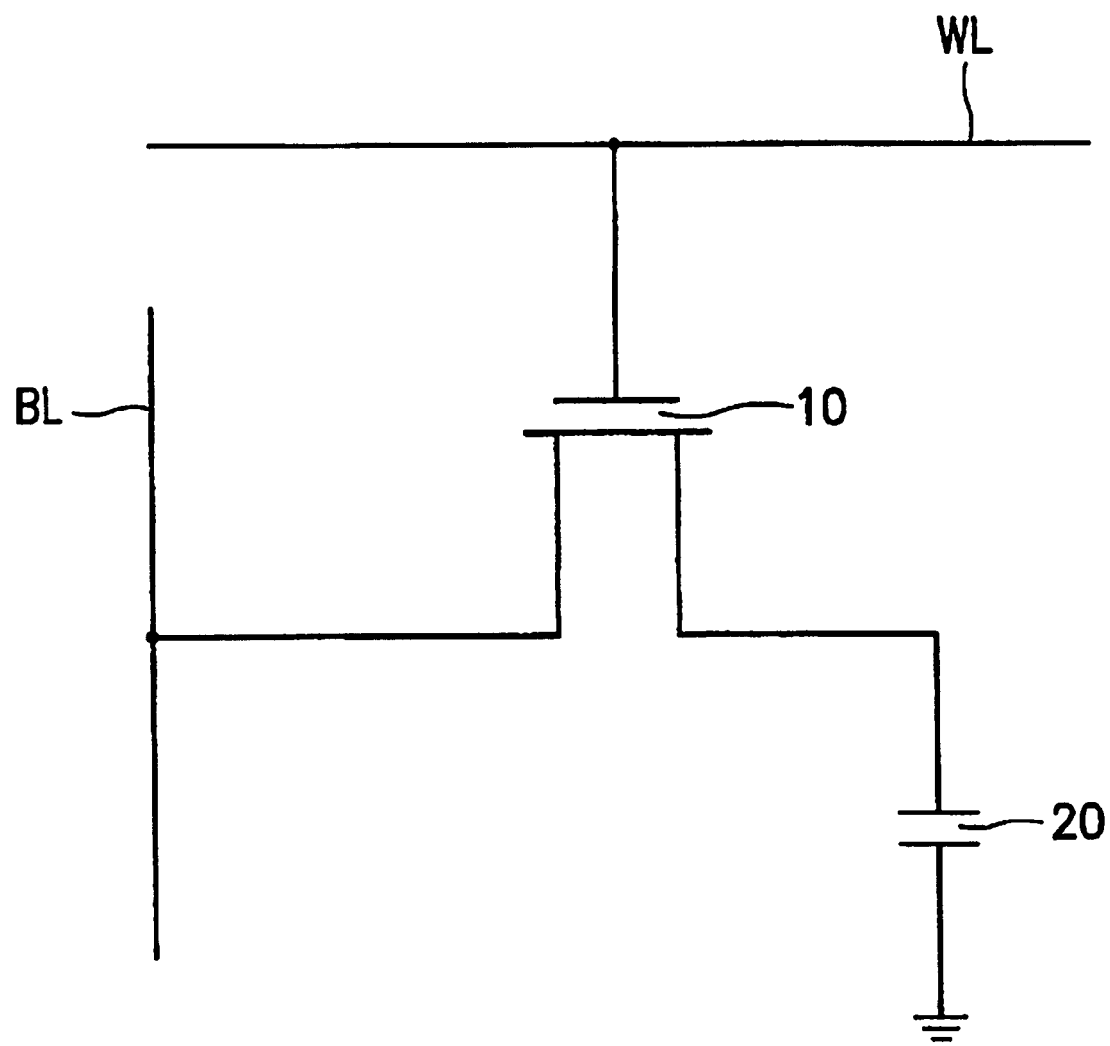
FIG. 1 shows a circuit diagram of a DRAM cell.
Figure 2A:
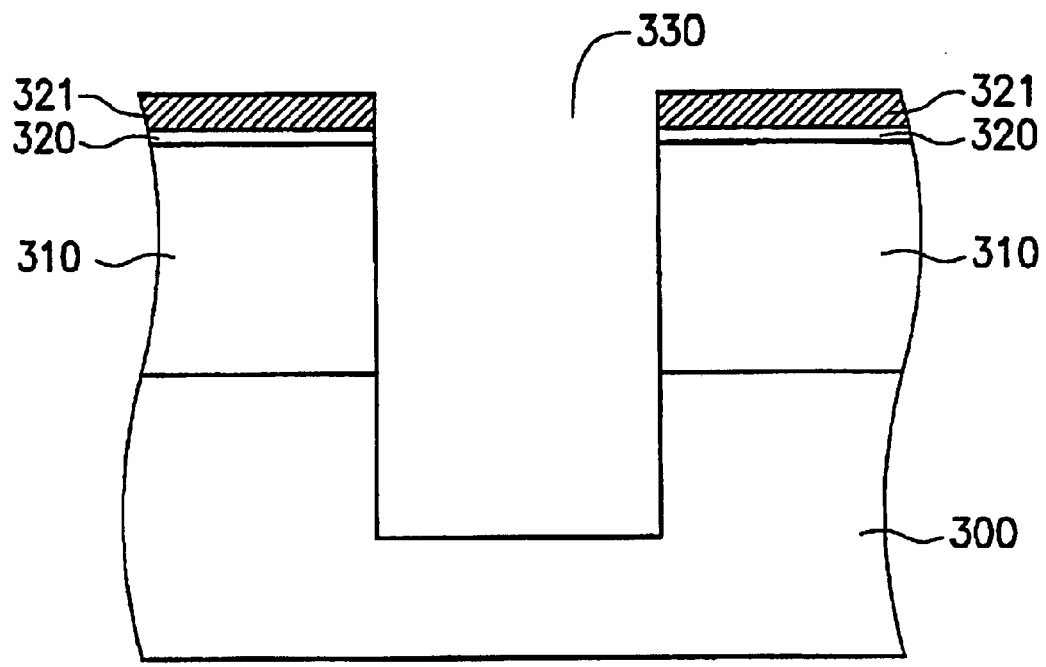
FIGS. 2a to 2f are cross-sections illustrating an exemplary process flow of fabricating a trench capacitor according to the present invention.

Referring to FIG. 2a, first, a semiconducting substrate 300 is provided. An epitaxial layer 310 is formed on the semiconducting substrate 300, and a first pad layer 320 and a second pad layer 321 are successively formed on the epitaxial layer 310. For example, the semiconducting substrate 300 is a P-type semiconducting substrate, the first pad layer 320 Is silicon oxide, and the second pad layer 321 is silicon nitride.

Subsequently, a hard mask (not shown) with an opening is formed on the second pad layer 321. For example, the hard mask is BSG (boron-silicate glass), nitride, or a combination thereof. The combination of BSG and nitride improves the trench quality and easily controls the conditions such as depth. The second pad layer 321, the first pad layer 320, the epitaxial layer 310, and the semiconducting substrate 300 are successively etched using the hard mask as a mask, forming a first trench 330 down into the semiconducting substrate 300.

Figure 2B:
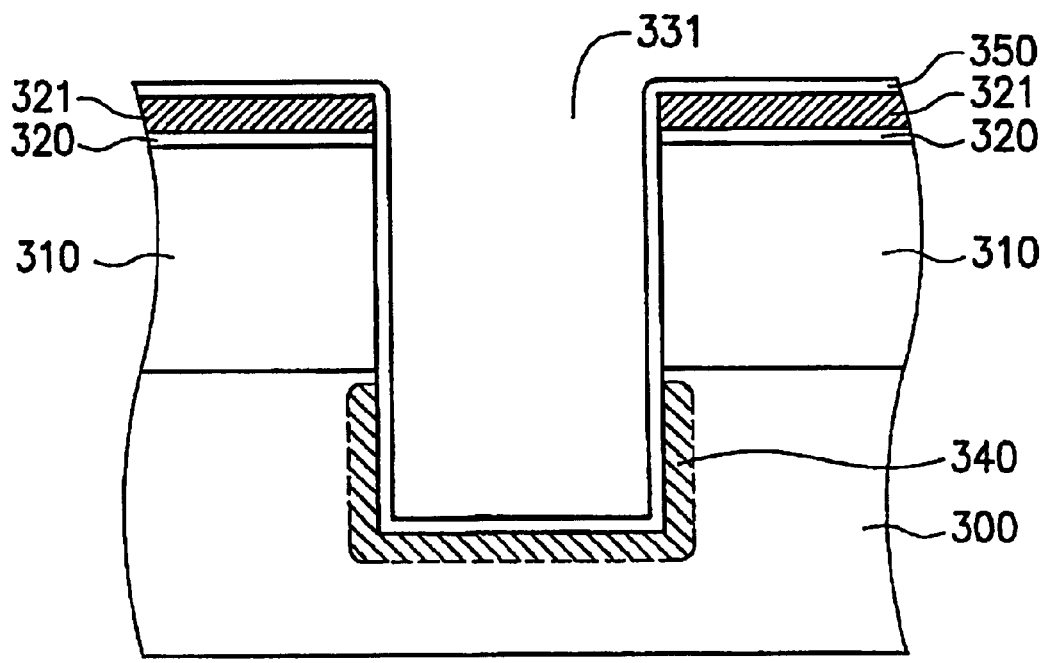

Subsequently, referring to FIG. 2b arsenic ions are diffused into the inner walls of the trench 330 by ion implantation to form a storage electrode layer 340, which will serve as an electrode plate of a trench capacitor.

Subsequently, silicon oxide/silicon nitride (ON) is conformally formed on the second pad layer 321 and the trench 330 by chemical vapor deposition (CVD) to form a dielectric layer 350 and a second trench 331. The dielectric layer 350 is, for example, silicon oxide.

Figure 2C:
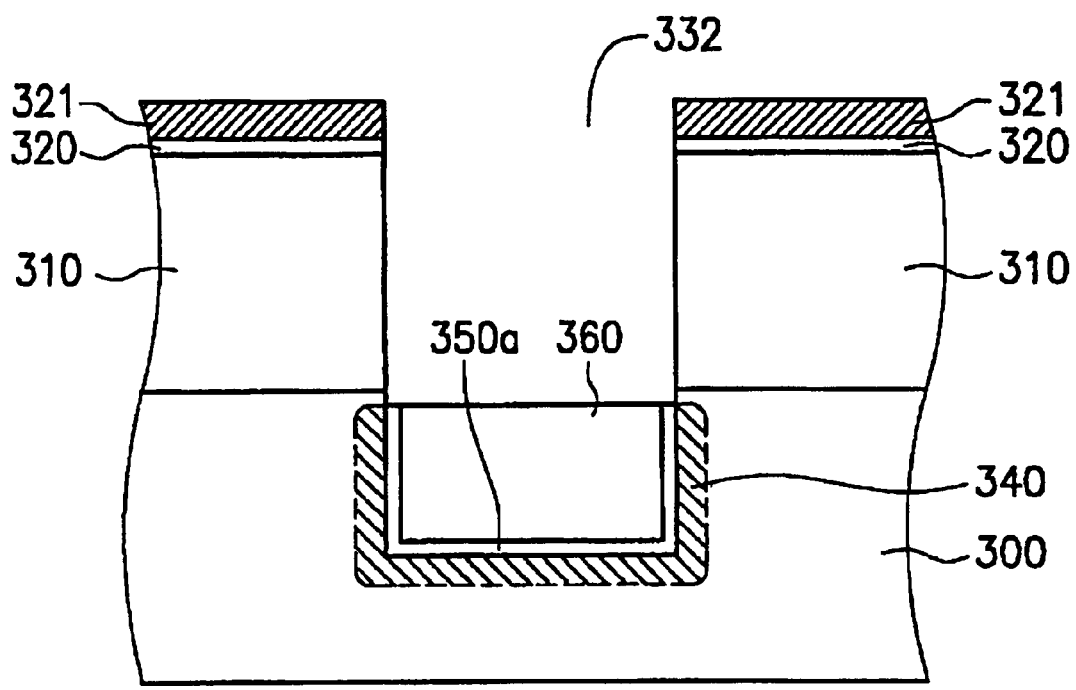

Subsequently, referring to FIGS. 2b and 2c together, polysilicon heavily doped with arsenic (not shown) is deposited on the dielectric layer 350 to fill in the trench 331. Next, the heavily doped polysilicon is planarized to expose the surface of the dielectric layer 350. The residual heavily doped polysilicon is etched to form a first conducting layer 360.

Subsequently, the exposed dielectric layer 350 is etched using the second pad layer 321 as a mask to form a dielectric layer 350a, which serves as the dielectric material between two electrode plates of the trench capacitor. A third trench 332 is formed simultaneously.

Figure 2D:
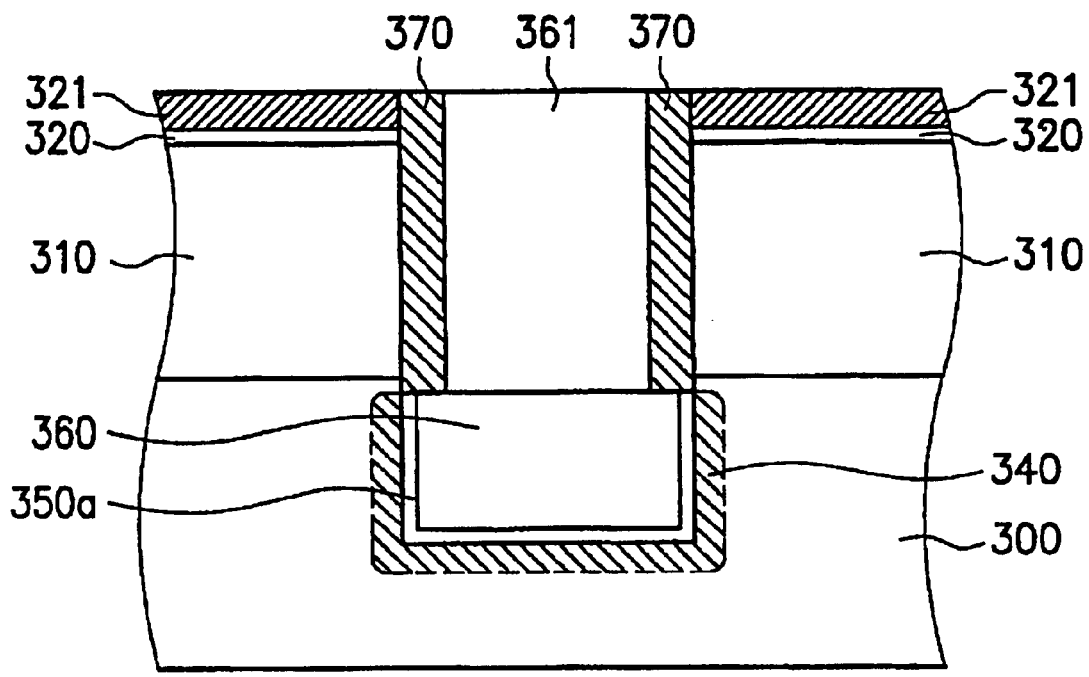

Subsequently, referring to FIG. 2d, a collar insulating layer 370 is formed on the sidewalls of the third trench 332. A second conducting layer 361 is formed to fill in the third trench 332. The collar insulating layer 370 can be silicon oxide, which serves as insulation and prevents current leakage. The second conducting layer 361 can be polysilicon heavily doped with arsenic and formed by deposition.

Figure 2E:
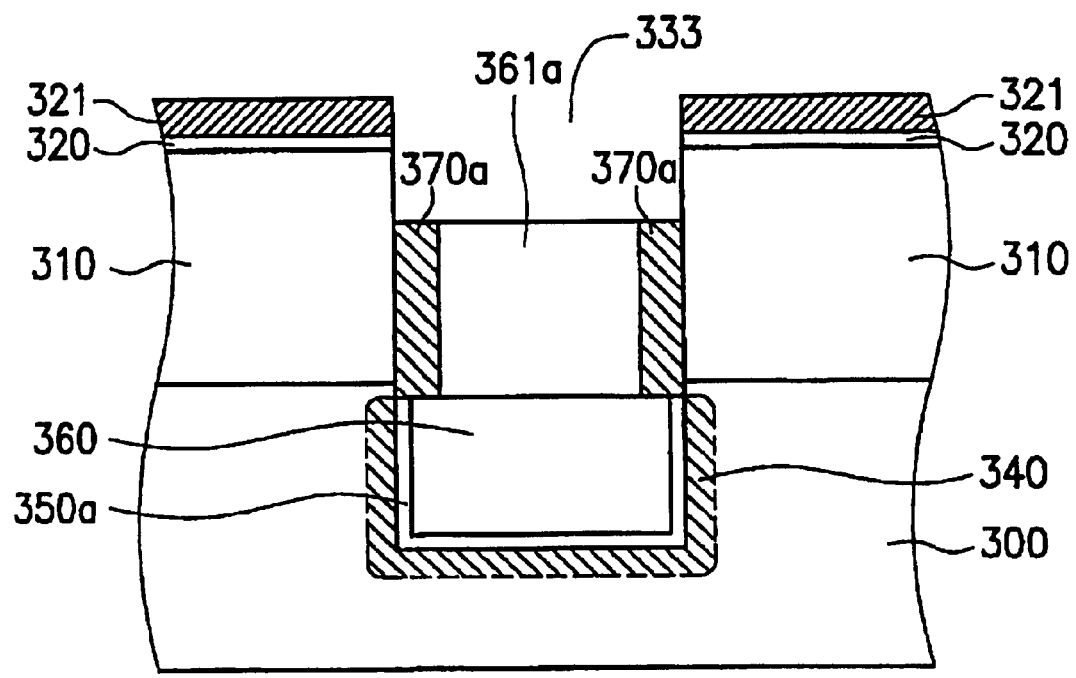

Subsequently, referring to FIG. 2e, the collar insulating layer 370 and the second conducting layer 361 are selectively etched to form a collar insulating layer 370a and a second conducting layer 361a in the third trench 332. A fourth trench 333 is formed simultaneously.

Figure 2F:
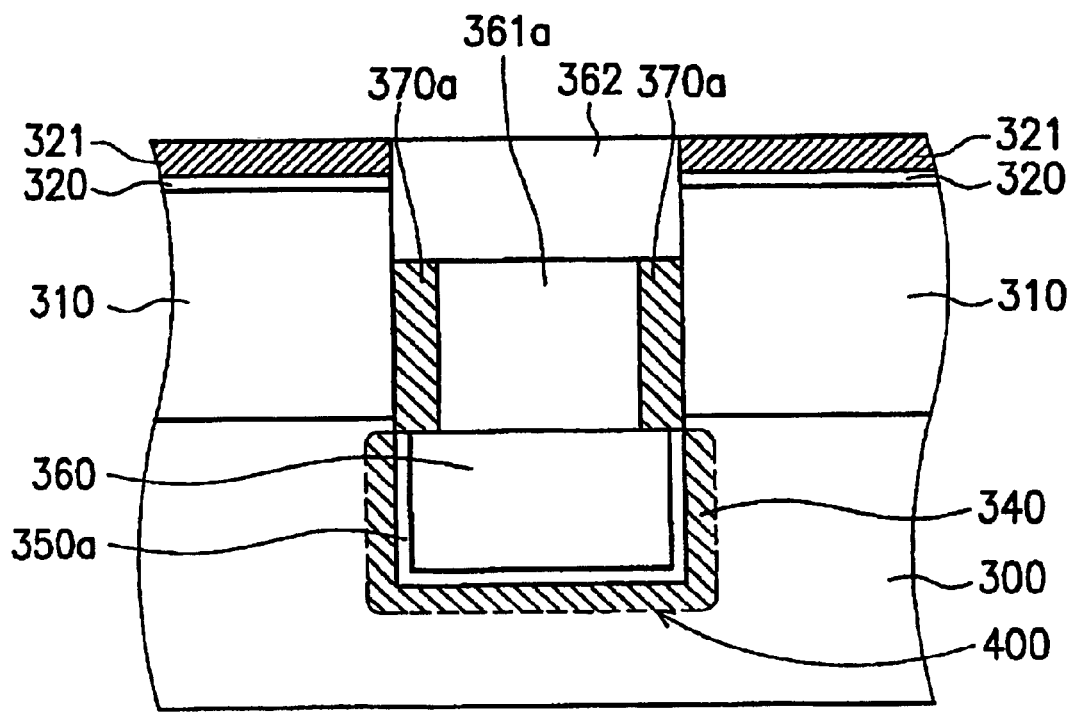

Finally, referring to FIG. 2f, polysilicon heavily doped with arsenic (not shown) is deposited on the silicon nitride layer 321 to fill in the fourth trench 333, which is then planarized to expose the second pad layer 321 to form a third conducting layer 362. The first, second, and third conducting layers 360, 361a, and 362, the dielectric layer 350a, the collar insulating layer 370a, and the storage electrode layer 340 constitute together a trench capacitor 400.

Figure 2G:
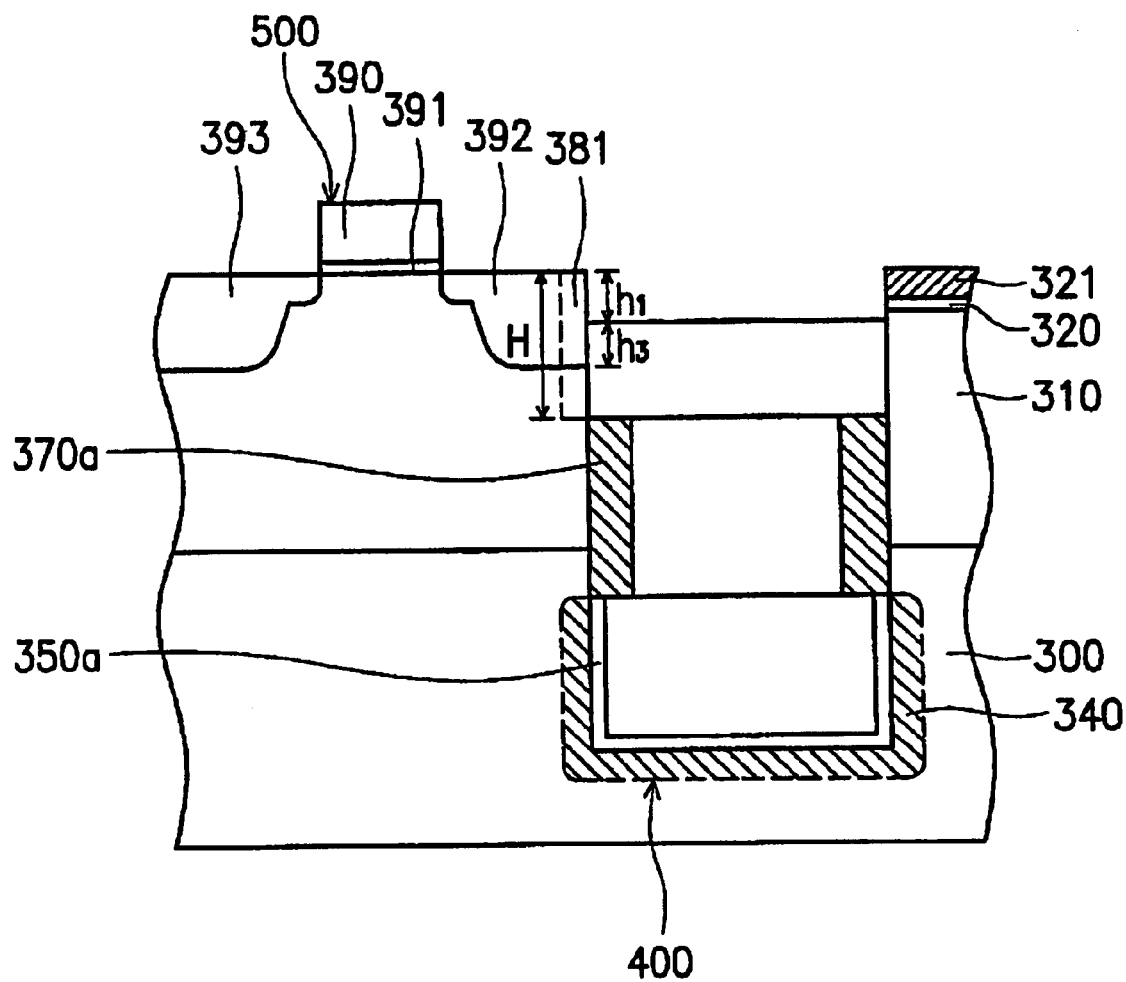
FIG. 2g is a cross-section of an exemplary structure including a trench capacitor connected to a transistor according to the present invention.

FIG. 2g shows an exemplary structure including the trench capacitor 400 and a transistor 500 on the semiconducting substrate 300.

In the transistor 500, a gate dielectric layer 391 and a gate 390 are formed on the epitaxial layer 310. A source 392 and a drain 393 are formed in the epitaxial layer 310 along the two sides of the gate 390. The source 392 connects to the trench capacitor 400 by a buried strap (BS) 381, which is formed by diffusion of the trench capacitor 400. The gate 390 can be P-type polysilicon, the gate dielectric layer 391 can be oxide or low dielectric constant material, and the source and drain 392 and 393 can be N-type diffusion regions such as arsenic implantation regions.

Subsequently, the procedures of measuring the depth of source/drain according to the embodiment of the present invention are described.

(a) First, a voltage is applied to the gate 390 in order to switch on the DRAM. Electrons move from the drain 393 to the source 392 and into the trench capacitor 400.

(b) The resistance of the buried strap 381 is related to the area of the buried strap 381 by the following formula (F1):

$$BSRC \;\alpha\; (\rho \cdot L/A) \qquad (F1)$$

$$A = D \times H$$

wherein BSRC indicates the resistance, $\rho$ the material properties, L the length, A the cross-sectional area, D the width of the cross-sectional area, and H the depth of the cross-sectional area of the buried strap 381.

In this embodiment, the material properties of the buried strap 381 is constant, and the length is constant. Therefore, only the cross-sectional area of the buried strap 381 influences the resistance. Moreover, the width of the cross-sectional area of the buried strap 381 is also constant. Therefore, only the depth of the cross-sectional area of the buried strap 381 influences the resistance of the buried strap 381.

(c) Subsequently, the resistances of the buried strap 381 at different depths are measured.

Figure 3:
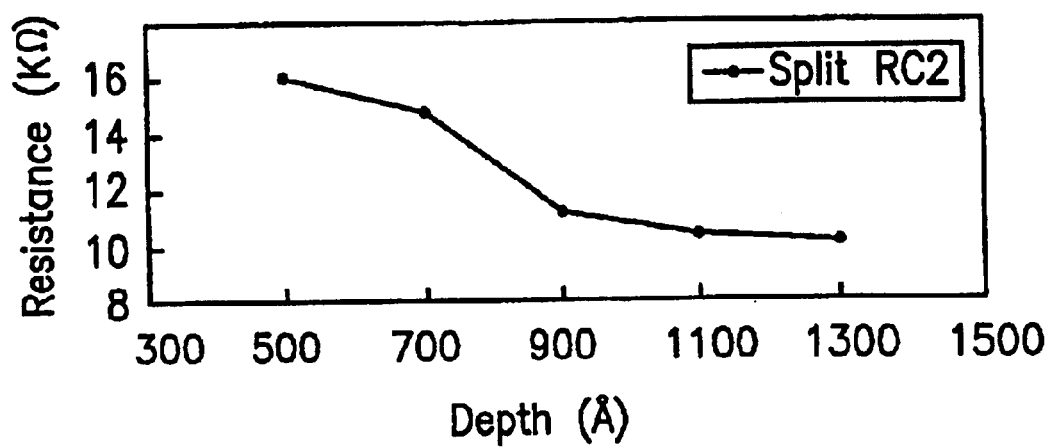
FIG. 3 is a diagram of the depth versus resistance of a buried strap according to an embodiment of the present invention.

For example, the resistances of the buried strap 381 at depths of 500 Å, 700 Å, 900 Å, 1100 Å, and 1300 Å are measured to be 13.0 KΩ, 12.3 KΩ, 10.8 KΩ, 10.7 KΩ, and 10.5 KΩ respectively. The depth vs. resistance diagram for the buried strap is depicted as FIG. 3. It can be seen from FIG. 3 that when the depth H of the buried strap 381 increases up to a critical depth 900 Å, no matter how much the depth increases, the measured resistance of the buried strap 381 does not change significantly and is about 10.7 K. Also, no matter what is the total depth of the buried strap 381 is, the critical depth does not change. Accordingly, the critical depth is the depth of the source 392 and drain 393.

In addition, when the buried strap 381 is below the semiconducting substrate by a length $h_1$. The actual depth ($h_3$) of the source 392 is obtained by subtracting the length $h_1$ from the critical depth.

According to the process of the present invention, it is very simple and quick to measure the depth of the source and drain. Thus, the quality of DRAM can be effectively controlled.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for measuring a depth of a source and drain of a MOS transistor, wherein the MOS transistor is formed on a semiconducting substrate on which a trench capacitor is formed and wherein a buried strap is formed between the MOS transistor and the trench capacitor, the process comprising the following steps:

measuring resistances of the buried strap at a plurality of different depths of the buried strap;

establishing a curve correlating the resistances with the depths of the buried strap;

obtaining slopes of the resistances to the depths of the buried strap for the curve; and obtaining a critical depth corresponding to a minimum resistance before the slopes of the resistances to the depths of the buried strap reaches to zero, wherein the critical depth is the depth of a source and drain of a MOS transistor.

2. A process for measuring a depth of a source and drain of a MOS transistor, wherein the MOS transistor is formed on a semiconducting substrate on which a trench capacitor is formed, wherein a buried strap is formed between the MOS transistor and the trench capacitor, wherein the buried strap is below an upper surface of the semiconducting substrate by a first length and the buried strap has a second length, wherein the buried strap is adjacent to a source of the MOS transistor, and wherein the source has a third length, the process comprising the following steps:

measuring resistances of the buried strap at a plurality of different depths of the buried strap over the second length;

establishing a curve correlating the resistances with the depths of the buried strap;

obtaining slopes of the resistances to the depths of the buried strap for the curve;

obtaining a critical depth corresponding to a minimum resistance before the slopes of the resistances to the depths of the buried strap reaches to zero; and subtracting the first length from the critical depth to obtain the third length.

* * * * *